United States Patent
Han et al.

(10) Patent No.: US 8,610,239 B2
(45) Date of Patent: Dec. 17, 2013

(54) SEMICONDUCTOR DEVICE AND METHOD OF MANUFACTURING THE SAME

(75) Inventors: Seung-Uk Han, Suwon-si (KR); Satoru Yamada, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 1 day.

(21) Appl. No.: 13/456,261

(22) Filed: Apr. 26, 2012

(65) Prior Publication Data

US 2012/0280310 A1 Nov. 8, 2012

(30) Foreign Application Priority Data

May 2, 2011 (KR) .................. 10-2011-0041295

(51) Int. Cl.
*H01L 21/70* (2006.01)
(52) U.S. Cl.
USPC ...... 257/509; 257/501; 257/330; 257/E29.02; 438/207; 438/270
(58) Field of Classification Search
USPC .................. 257/330, 501, 506, 509, 510, 513, 257/E29.02, E29.262, E21.41; 438/207, 438/218, 221, 270, 294
See application file for complete search history.

(56) References Cited

U.S. PATENT DOCUMENTS

2010/0059814 A1* 3/2010 Loechelt et al. .............. 257/330

FOREIGN PATENT DOCUMENTS

| KR | 10-2003-0002703 A | 1/2003 |
| KR | 10-2005-0011487 A | 1/2005 |
| KR | 10-2006-0002057 A | 1/2006 |

* cited by examiner

*Primary Examiner* — Tucker Wright
(74) *Attorney, Agent, or Firm* — Lee & Morse, P.C.

(57) ABSTRACT

A semiconductor device including an isolation layer structure including a doped polysilicon layer pattern doped with first and second impurities of first and second conductivity types at lower and upper portions thereof, the doped polysilicon layer pattern being on an inner wall of a first trench on a substrate including an active region in which the first trench is not formed and a field region including the first trench, and an insulation structure filling a remaining portion of the first trench; a gate structure on the active region; a well region at a portion of the active region adjacent to lower portions of the doped polysilicon layer pattern and being doped with third impurities of the second conductivity type; and a source/drain at a portion of the active region adjacent to upper portions of the doped polysilicon layer pattern and being doped with fourth impurities of the first conductivity type.

20 Claims, 8 Drawing Sheets

SEMICONDUCTOR DEVICE AND METHOD OF MANUFACTURING THE SAME

CROSS-REFERENCE TO RELATED APPLICATION

This application claims priority under 35 USC §119 to Korean Patent Application No. 10-2011-0041295 filed on May 2, 2011 in the Korean Intellectual Property Office (KIPO), the contents of which are herein incorporated by reference in their entirety.

BACKGROUND

1. Field

Embodiments relate to a semiconductor device and a method of manufacturing the same.

2. Description of the Related Art

To reduce a body effect of a metal oxide semiconductor (MOS) transistor, ions may be lightly doped into a body region of the MOS transistor. However, in this case, a threshold voltage of the transistor may be decreased, so that an off leakage current may be increased. Additionally, a high ion concentration of a source/drain may generate a gate induced drain leakage (GIDL) current, thereby deteriorating characteristics of the transistor. Accordingly, reducing the body effect and the GIDL current are desirable.

SUMMARY

Embodiments are directed to a semiconductor device and a method of manufacturing the same.

The embodiments may be realized by providing a semiconductor device including an isolation layer structure, the isolation structure including a doped polysilicon layer pattern doped with first and second impurities of first and second conductivity types at lower and upper portions thereof, respectively, the doped polysilicon layer pattern being on an inner wall of a first trench on a substrate, the substrate being divided into an active region in which the first trench is not formed and a field region in which the first trench is formed, and an insulation structure filling a remaining portion of the first trench; a gate structure on the active region of the substrate; a well region at a portion of the active region adjacent to the lower portion of the doped polysilicon layer pattern, the well region being doped with third impurities of the second conductivity type; and a source/drain at a portion of the active region adjacent to the upper portion of the doped polysilicon layer pattern, the source/drain being doped with fourth impurities of the first conductivity type.

The insulation structure may include a first insulation layer pattern and a second insulation layer pattern sequentially stacked thereon.

The isolation layer structure may further include a nitride layer pattern between the inner wall of the first trench and the doped polysilicon layer pattern.

The isolation layer structure may further include a thermal oxide layer pattern between the inner wall of the first trench and the nitride layer pattern.

The gate structure may fill a second trench in the active region.

The embodiments may also be realized by providing a method of manufacturing a semiconductor device, the method including forming an isolation layer structure such that forming the isolation layer structure includes forming a doped polysilicon layer pattern doped with first and second impurities of first and second conductivity types at lower and upper portions thereof, respectively, the doped polysilicon layer pattern being on an inner wall of a first trench on a substrate, the substrate being divided into an active region in which the first trench is not formed and a field region in which the first trench is formed, and forming an insulation structure on the doped polysilicon layer pattern to fill a remaining portion of the first trench; forming a well region by implanting third impurities of the second conductivity type into a portion of the active region adjacent to the lower portion of the doped polysilicon layer pattern; forming a gate structure on the active region; and forming a source/drain by implanting fourth impurities of the first conductivity type into a portion of the active region adjacent to the upper portion of the doped polysilicon layer pattern.

The first conductivity type may be n-type, and the second conductivity type may be p-type.

The first and fourth impurities may include one of phosphorus, arsenic, and antimony, and the second and third impurities may include one of boron, aluminum, gallium, and indium.

Forming the isolation layer structure may include forming a polysilicon layer doped with the first impurities on the inner wall of the first trench and a top surface of the substrate, forming a first insulation layer pattern on the doped polysilicon layer to partially fill the first trench, implanting the second impurities into a portion of the doped polysilicon layer not covered by the first insulation layer pattern, and forming a second insulation layer pattern on the first insulation layer pattern to fill a remaining portion of the first trench.

Forming the first insulation layer pattern may include forming a first insulation layer on the doped polysilicon layer to sufficiently fill the first trench, and removing an upper portion of the first insulation layer by a wet etching process.

Forming the second insulation layer pattern may include forming a second insulation layer on the first insulation layer pattern to fill a remaining portion of the first trench, and planarizing an upper portion of the second insulation layer.

A top surface of the well region may be substantially coplanar with a top surface of the lower portion of the doped polysilicon layer pattern doped with the first impurities.

A bottom surface of the source/drain may be substantially coplanar with a bottom surface of the upper portion of the doped polysilicon layer pattern doped with the second impurities.

The method may further include forming a nitride layer on the inner wall of the first trench prior to forming the doped polysilicon layer pattern.

The method may further include forming a thermal oxide layer on the inner wall of the first trench prior to forming the gate structure.

The embodiments may also be realized by providing a semiconductor device including a substrate including a trench therein, the substrate including an active region and a field region and the trench being in the field region; an isolation layer structure in the trench, the isolation structure including a thermal oxide layer pattern on an inner wall of the trench, a doped polysilicon layer pattern on the thermal oxide layer pattern, the doped polysilicon layer being doped with first impurities having a first conductivity type at a lower portion thereof and being doped with second impurities of a second conductivity type at an upper portion thereof, and an insulation structure on the doped polysilicon layer pattern, the insulation structure filling a remaining portion of the trench; a gate structure on the active region of the substrate; a well region at a portion of the active region adjacent to the lower portion of the doped polysilicon layer pattern, the well region being doped with third impurities of the second conductivity type; and a source/drain at a portion of the active region adjacent to the upper portion of the doped polysilicon layer pattern, the source/drain being doped with fourth impurities of the first conductivity type.

A top surface of the well region may be substantially coplanar with a bottom surface of the upper portion of the doped polysilicon layer pattern.

A bottom surface of the well region may be substantially coplanar with or higher than a bottom surface of the isolation layer structure.

A bottom surface of the source/drain may be substantially coplanar with a bottom surface of the upper portion of the doped polysilicon layer pattern.

The isolation layer structure may further include a nitride layer pattern between the thermal oxide layer pattern and the doped polysilicon layer pattern.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
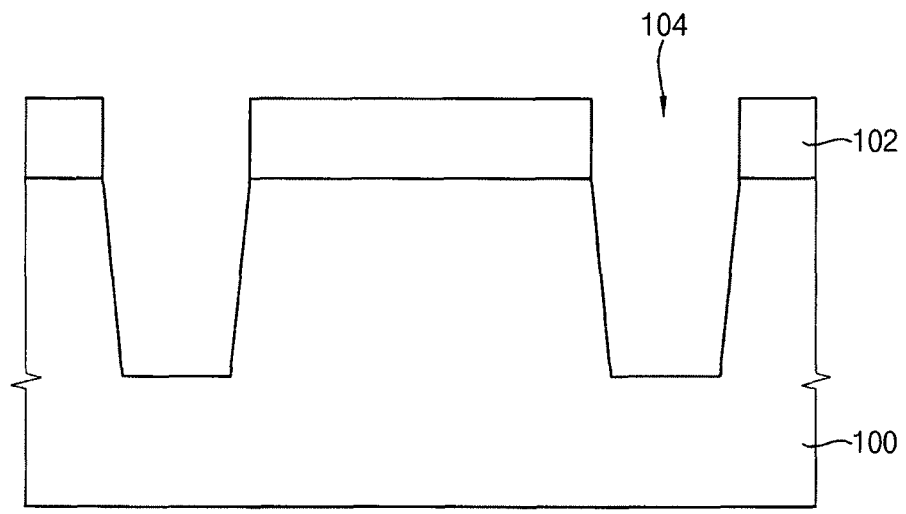
FIGS. 1 to 12 illustrate cross-sectional views of stages in a method of manufacturing a semiconductor device in accordance with an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It will be understood that when an element or layer is referred to as being "connected to" or "coupled to" another element or layer, it can be directly connected or coupled to the other element or layer or intervening elements or layers may be present. In contrast, when an element is referred to as being "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90degrees or at other orientations) and the spatially relative descriptors used herein interpreted accordingly.

The terminology used herein is for the purpose of describing particular example embodiments only and is not intended to be limiting of the embodiments. As used herein, the singular forms "a," "an" and "the" are intended to include a plurality of forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, e.g., of manufacturing techniques and/or tolerances, may be expected. Thus, example embodiments should not be construed as limited to the particular shapes of regions illustrated herein but are to include deviations in shapes that result, e.g., from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the embodiments.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1 to 12 illustrate cross-sectional views of stages in a method of manufacturing a semiconductor device in accordance with an embodiment. The semiconductor device may include an n-channel metal oxide semiconductor (NMOS) transistor.

Referring to FIG. 1, a hard mask 102 may be formed on a substrate 100. In an implementation, the hard mask 102 may be formed using silicon nitride. Prior to forming the hard mask 102, a pad oxide layer (not illustrated) may be formed on the substrate 100.

The substrate 100 may include a semiconductor substrate, e.g., a silicon substrate, a germanium substrate, a silicon-germanium substrate, or the like. In an implementation, the substrate 100 may include single-crystalline silicon.

An upper portion of the substrate 100 may be removed using the hard mask 102 as an etching mask to form a first trench 104 on or in the substrate 100. In an implementation, the first trench 104 may be formed to extend along a first direction.

Figure 2:
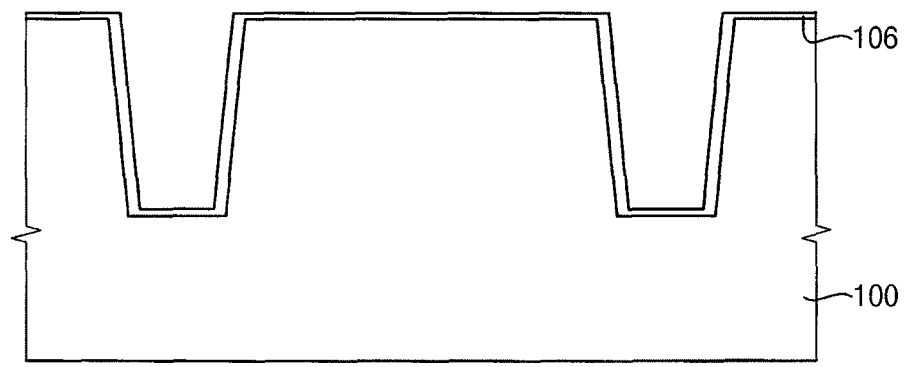

Referring to FIG. 2, a thermal oxide layer 106 may be formed on an inner wall of the first trench 104 and a top surface of the substrate 100. Thus, damage to the substrate 100 from, e.g., an impact of high energy ions during an etching process may be reduced and/or prevented. In an implementation, the thermal oxide layer 106 may be formed by a heat treatment on the inner wall of the first trench 104 and the top surface of the substrate 100 under an oxygen-containing atmosphere.

Figure 3:
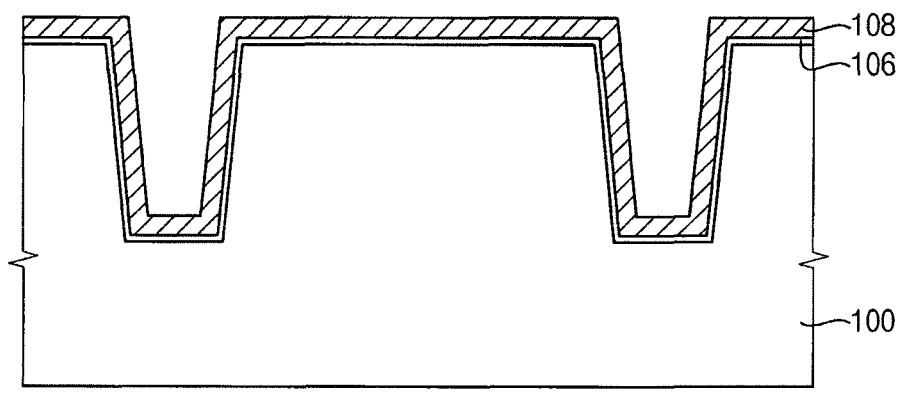

Referring to FIG. 3, a polysilicon layer 108 doped with first impurities may be formed on the thermal oxide layer 106.

In an implementation, the first impurities may include n-type impurities, e.g., phosphorus (P), arsenic (As), antimony (Sb), or the like. When the doped polysilicon layer 108 includes n-type impurities, electrons may move to a p-well region 145 (see FIG. 12) subsequently formed at a portion of the substrate 100. Thus, a doping concentration of p-type impurities in the p-well region 145 may decrease. If the first impurities include p-type impurities, carriers may not move to the p-well region 145, so that the doping concentration of the p-type impurities in the p-well region 145 may not decrease. Accordingly, when the p-well region 145 is formed in the substrate, n-type impurities (as the first impurities) may be doped in the polysilicon layer 108.

In an implementation, the doped polysilicon layer 108 may be doped with phosphorus (P) and may have a thickness of about 30 Å to about 100 Å.

In an implementation, a polysilicon layer (not illustrated) may be formed on the substrate 100 having the first trench 104 thereon by a chemical vapor deposition (CVD) process, and the first impurities may be implanted into the polysilicon layer to form the doped polysilicon layer 108. In another implementation, while the polysilicon layer is deposited, a source gas including the first impurities may be used to form the doped polysilicon layer 108.

Figure 4:
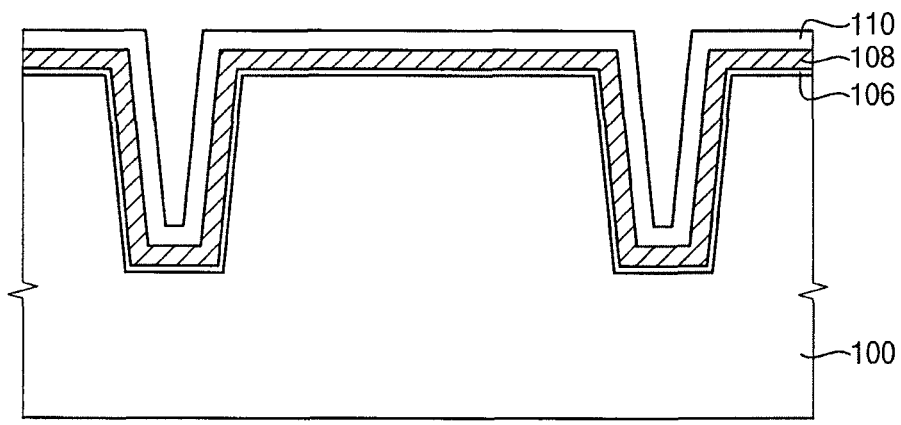

Referring to FIG. 4, a nitride layer 110 may be formed on the doped polysilicon layer 108. In an implementation, the nitride layer 110 may be formed using silicon nitride and may have a thickness of about 200 Å to about 300 Å.

The nitride layer 110 may help reduce the possibility of and/or prevent the doped polysilicon layer 108 from being thermally oxidized when a first insulation layer 120 (see FIG. 5) is thermally treated after the first insulation layer 120 is filled into the first trench 104. Additionally, the nitride layer 110 may serve as a polishing stop layer in a planarization process of the first insulation layer 120. Furthermore, when second impurities (see FIG. 8) are implanted into an upper portion of the doped polysilicon layer 108, the nitride layer 110 may impede the doping of the second impurities to control a doping depth thereof.

Figure 5:
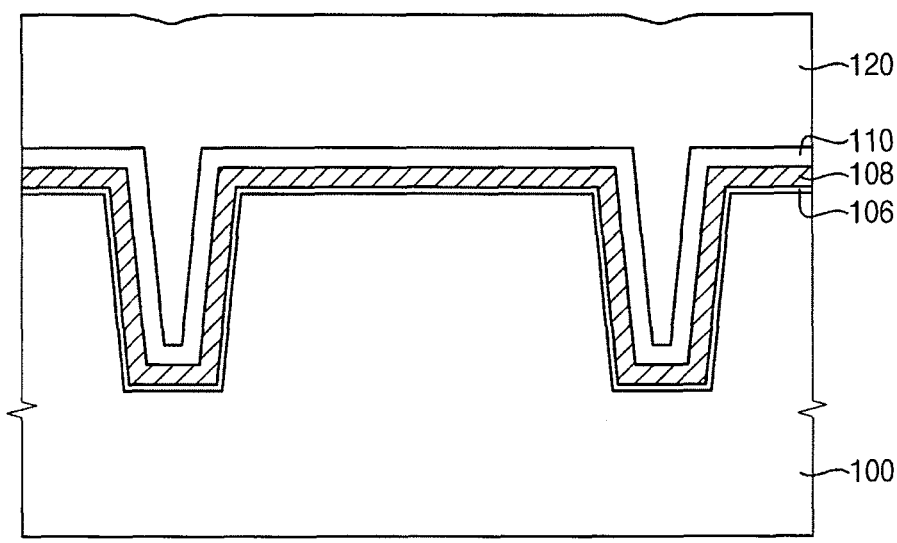

Referring to FIG. 5, the first insulation layer 120 may be formed on the nitride layer 110 to fill a remaining portion of the first trench 104.

In an implementation, the first insulation layer 120 may include high density plasma (HDP) oxide, a silicate type oxide, e.g., undoped silicate glass (USG), boron doped silicate glass (BSG), phosphorus doped silicate glass (PSG), boron doped phosphorus silicate (BPSG) glass, or the like, or a spin on glass (SOG) having silazane, silanol, silsesquioxane, or the like. In an implementation, the first insulation layer 120 may be formed on the nitride layer 110 to have a thickness of about 5,000 Å to about 6,000 Å.

When the first trench 104 has a narrow width, the first insulation layer 120 may be formed using, e.g., BPSG or SOG, which are flowable, so that generation of a void in the first trench 104 may be reduced and/or prevented.

For example, when the first insulation layer 120 is formed using SOG, an SOG solution including perhydrosilazane (having good gap filling characteristics) may be spread onto the nitride layer 110 by a spin coating process. Then, the substrate 100 having the SOG layer thereon may be rinsed to remove a remaining SOG solution on a top surface and a bottom surface of the substrate 100. A soft baking process may be performed on the substrate 100 at a temperature of about 120° C. to about 300° C., and a hard baking process may be performed on the substrate 100 at a temperature of about 350° C. to about 450° C. to form the first insulation layer 120.

When the first insulation layer 120 is formed using BPSG, a CVD process may be used.

Figure 6:
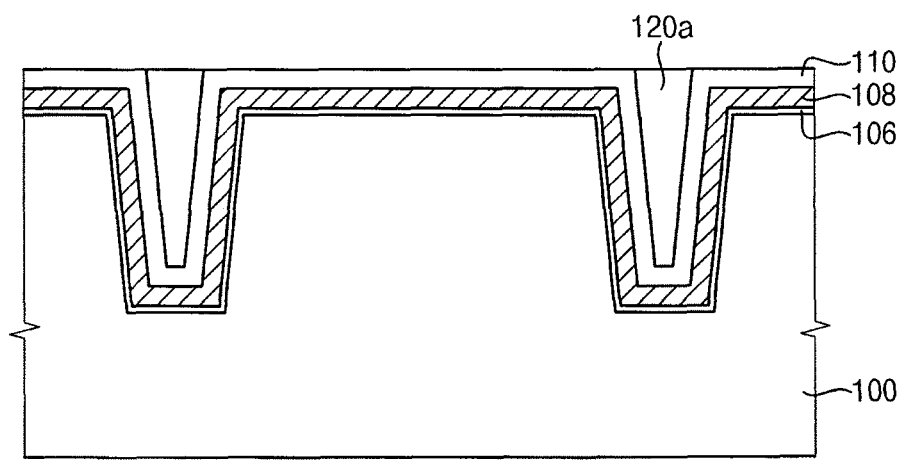

Referring to FIG. 6, the first insulation layer 120 may be planarized (until a top surface of the nitride layer 110 is exposed) by an etch-back process or a chemical mechanical polishing (CMP) process to form a preliminary first insulation layer pattern 120a in the first trench 104.

Figure 7:
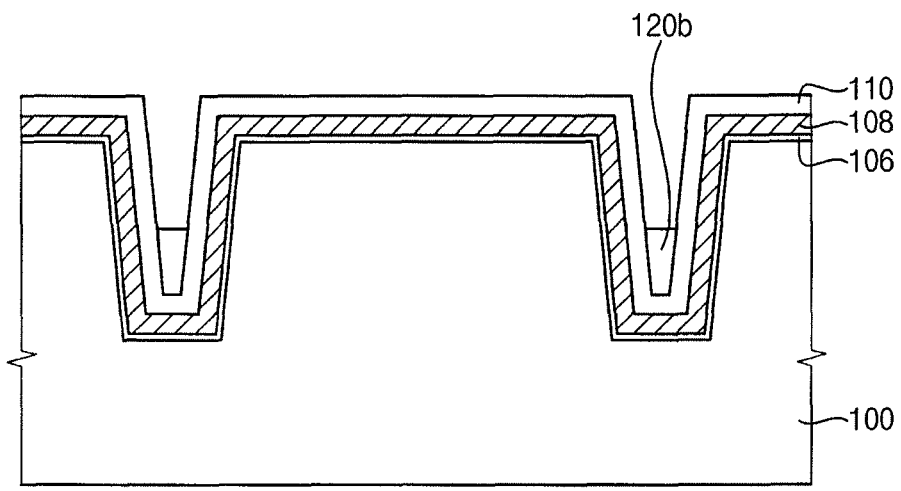

Referring to FIG. 7, a wet etching process may be performed to remove an upper portion of the preliminary first insulation layer pattern 120a using a wet etching solution having an etching selectivity with respect to silicon nitride and silicon oxide. Thus, the preliminary first insulation layer pattern 120a may be changed to a first insulation layer pattern 120b having a top surface substantially lower than that of the substrate 100 in the trench 104. The wet etching solution may include hydrofluoric acid (HF) and/or ammonium fluoride ($NH_4F$).

An upper portion of the nitride layer 110 may be exposed by the wet etching process, and ions may be implanted into a portion of the doped polysilicon layer 108 under the exposed upper portion of the nitride layer 110.

Figure 8:
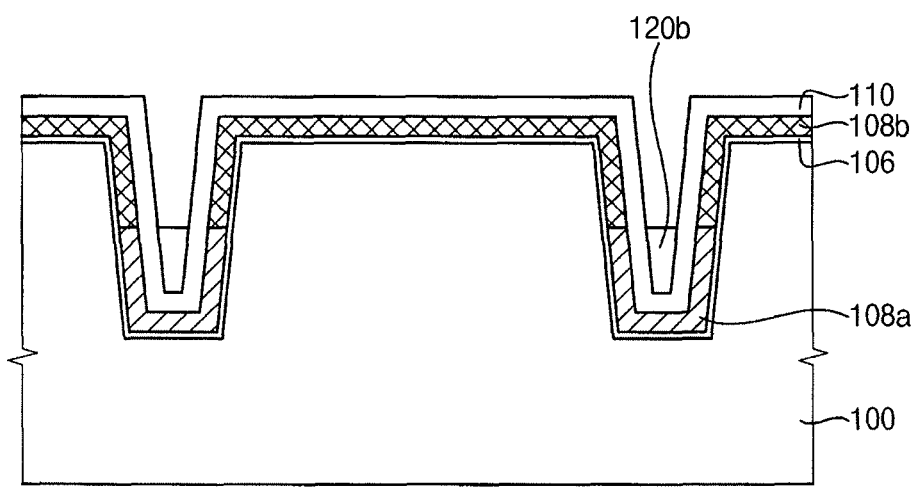

Referring to FIG. 8, the second impurities may be implanted into the portion of the doped polysilicon layer 108 under the exposed upper portions of the nitride layer 110. In an implementation, the second impurities may have a conductivity type opposite to impurities doped for forming a source/drain 180 (see FIG. 12).

For example, in a method of forming an NMOS transistor, the source/drain 180 may be formed by doping n-type impurities, so that p-type impurities, e.g., boron (B), aluminum (Al), gallium (Ga), indium (In), or the like, may be used as the second impurities. For example, boron (B), boron difluoride ($BF_2$), boron trifluoride ($BF_3$), or the like may be implanted into the portion of the doped polysilicon layer 108 by a low energy ion implantation process, a plasma ion implantation process, a pulsed laser ablation deposition process, or the like.

The p-type impurities may be implanted to a depth at which the source/drain 180 is formed. Thus, the doped polysilicon layer 108 may include a first polysilicon region 108a (doped with n-type impurities) and a second polysilicon region 108b (doped with p-type impurities) on the first polysilicon region 108a.

Figure 9:
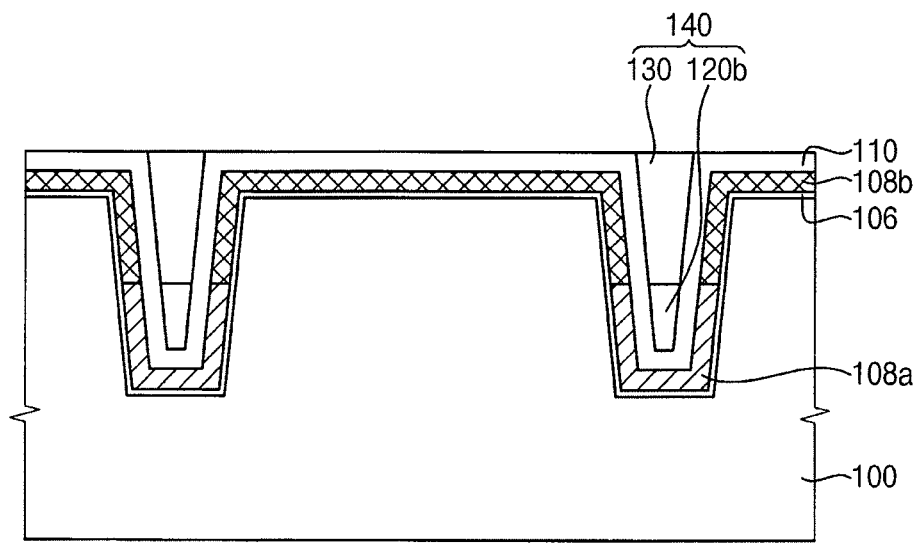

Referring to FIG. 9, a second insulation layer (not illustrated) may be formed on the first insulation layer pattern 102b and the nitride layer 110 to sufficiently fill a remaining portion of the first trench 104. The second insulation layer may be formed using, e.g., high density plasma (HDP) oxide, BPSG, SOG, or the like.

The second insulation layer may be planarized until the top surface of the nitride layer 110 is exposed to form a second insulation layer pattern 130.

The planarization may be performed by, e.g., an etch-back process or a CMP process. Accordingly, an insulation structure 140 including the sequentially stacked first insulation layer pattern 120b and second insulation layer pattern 130 may be formed on a portion of the nitride layer 110 in the first trench 104. The second insulation layer pattern 130 may be formed using an oxide substantially the same as or different from that of the first insulation layer pattern 120b.

Figure 10:
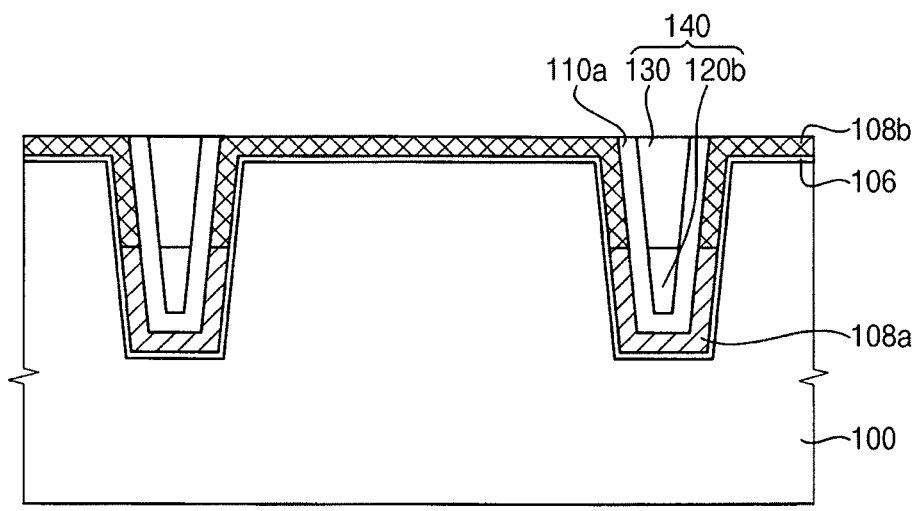

Referring to FIG. 10, an upper portion of the nitride layer 110 may be removed by a wet etching process until a top surface of the second polysilicon region 108b is exposed. An upper portion of the insulation structure 140 may also be partially removed. The upper portion of the nitride layer 110 may be removed using an etching solution including, e.g., HF, orthophosphoric acid ($H_3PO_4$), and deionized water. Accordingly, the nitride layer 110 may be changed to a nitride layer pattern 110a remaining only in the first trench 104. The nitride layer pattern 110a may help reduce stress to the insulation structure 140 in the first trench 104, and impurities in the doped polysilicon layer 108 may be prevented from moving to the insulation structure 140.

Figure 11:
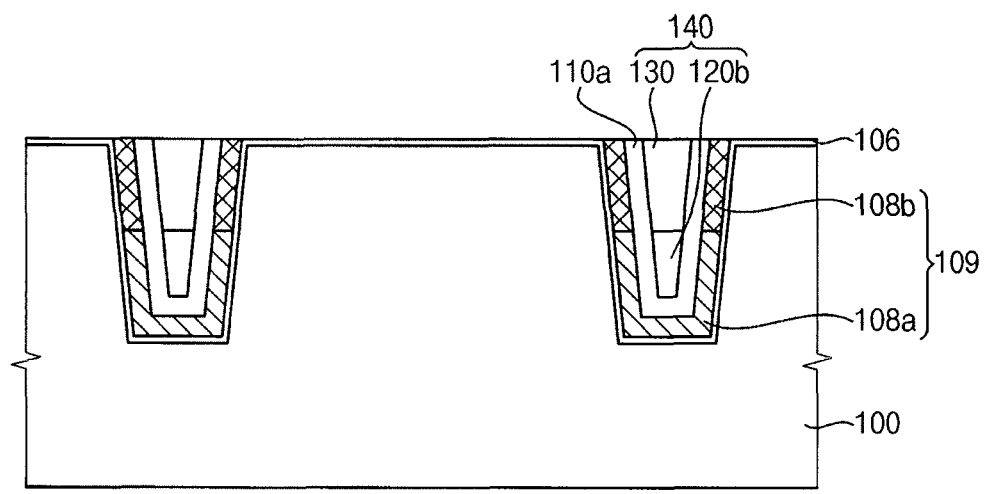

Referring to FIG. 11, an upper portion of the doped polysilicon layer 108 may be removed until a top surface of the thermal oxide layer 106 is exposed. The removal may be performed by, e.g., a dry etching process such as an etch-back process or a wet etching process using an etching solution including KOH. Thus, the doped polysilicon layer 108 may be changed to a doped polysilicon layer pattern 109 only in the first trench 104, and the second polysilicon region 108b doped with p-type impurities may remain only in the first trench 104. In the etching process, upper portions of the nitride layer pattern 110a and the insulation structure 140 may be partially removed.

Figure 12:
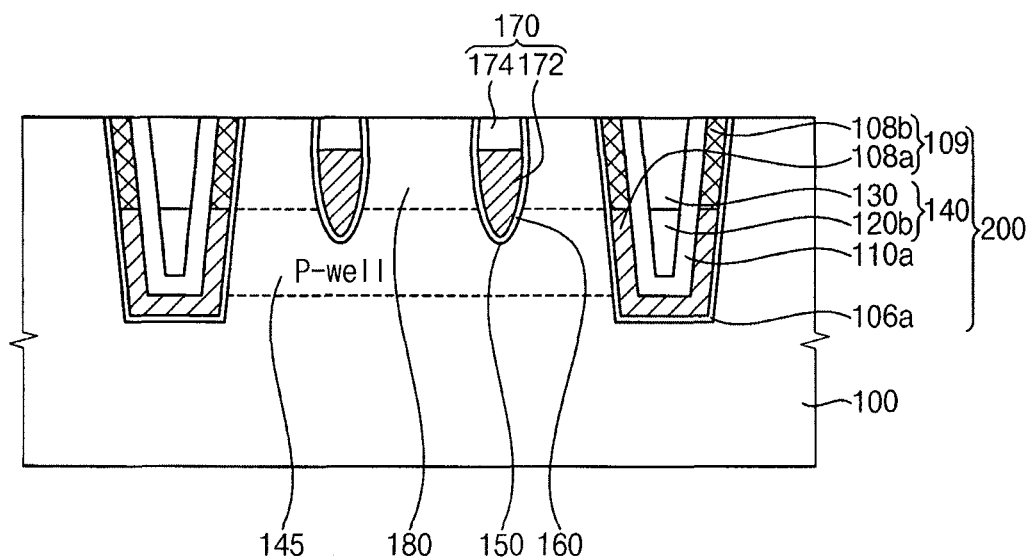

Referring to FIG. 12, a portion of the thermal oxide layer 106 on the top surface of substrate 100 may be removed. Accordingly, the thermal oxide layer 106 may be changed to a thermal oxide layer pattern 106a only in the first trench 104. The removal may be performed by a wet etching process.

By the above processes, an isolation layer structure 200 including the thermal oxide layer pattern 106a, the doped polysilicon layer pattern 109, the nitride layer pattern 110a, and the insulation structure 140 (sequentially stacked in the first trench 104) may be formed. The doped polysilicon layer pattern 109 may include the first polysilicon region 108a (doped with n-type impurities 108a at a lower portion thereof) and the second polysilicon region 108b (doped with p-type impurities at an upper portion thereof). The insulation structure 140 may include the sequentially stacked first insulation layer pattern 120b and second insulation layer pattern 130.

The substrate 100 may be divided by the isolation layer structure 200 into a field region (having the isolation layer structure 200 thereon) and an active region (having no isolation layer structure 200 thereon).

P-type impurities may be lightly implanted into an active region of the substrate 100 to form the p-well region 145. In an implementation, the p-type impurities may include boron.

In an implementation, a top surface of the p-well region 145 may be substantially coplanar with a bottom surface of the second polysilicon region 108b (doped with p-type impurities) of the doped polysilicon layer pattern 109. A bottom surface of the p-well region 145 may be substantially coplanar with or higher than a bottom surface of the isolation layer structure 200.

Electrons and holes at an interface between the second polysilicon region 108a (doped with n-type impurities) of the doped polysilicon layer pattern 109 and the p-well region 145 may be balanced, so that a doping concentration of p-type impurities in the p-well region 145 may decrease. Thus, a threshold voltage may not be increased due to the reduction of body effect, so that operation failure of the transistor may be reduced and/or prevented.

A mask pattern (not illustrated) may be formed on the substrate 100. A second trench 150 may be formed by etching a portion of the substrate 100 using the mask pattern as an etching mask.

After removing the mask pattern, a gate insulation layer 160 may be formed on an inner wall of the second trench 150. The gate insulation layer 160 may be formed using a high-k material, e.g., silicon oxide ($SiO_2$), hafnium oxide ($HfO_2$), hafnium silicon oxide (HfSiO), etc.

A gate structure 170 may be formed on the gate insulation layer 160 to fill the second trench 150. The gate structure 170 may include a sequentially stacked gate electrode 172 and mask 174. In an implementation, the gate electrode 172 may be formed using, e.g., a metal, a metal nitride, and/or a metal silicide, and the mask 174 may be formed using, e.g., a nitride or an oxide.

The source/drain 180 may be formed by implanting n-type impurities into upper portions of the substrate 100 adjacent to the gate structure 170. In an implementation, the source/drain 180 may be formed to have a depth shallower than a depth of the gate structure 170.

In an implementation, the source/drain 180 may be formed to have a bottom surface substantially coplanar with the bottom surface of the second polysilicon region 108b (doped with p-type impurities) of the doped polysilicon layer pattern 109. The second polysilicon region 108b of the doped polysilicon layer pattern 109 may have p-type impurities. Thus, electrons and holes may be balanced at an interface between the second polysilicon region 108b (doped with p-type impurities) and the source/drain 180. As a result, a concentration of impurities at an interface of the source/drain 180 may decrease. Thus, a GIDL current may decrease.

A contact (not illustrated) may be formed to contact the upper and lower portions of the doped polysilicon layer pattern 109, e.g., the second polysilicon region 108b doped with p-type impurities and the first polysilicon region 108a doped with n-type impurities. A bias voltage may be applied to the contact, so that balancing effects between electrons and holes of the source/drain 180 and the p-well region 145, respectively, may be maximized. For example, a negative voltage may be applied to the second polysilicon region 108b (doped with p-type impurities), and a positive voltage may be applied to the first polysilicon region 108a (doped with n-type impurities).

Hereinafter, an energy band diagram at boundary surfaces between the doped polysilicon layer pattern 109 and the p-well region 145, and the doped polysilicon layer pattern 109 and the source/drain 180 are described.

Figure 13:
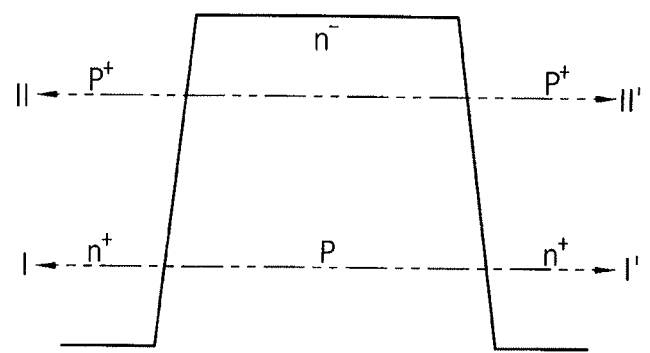
FIG. 13 illustrates a cross-sectional view of conductive types of impurities in a doped polysilicon layer pattern and an active region of a substrate in accordance with another embodiment.
Figure 14A:
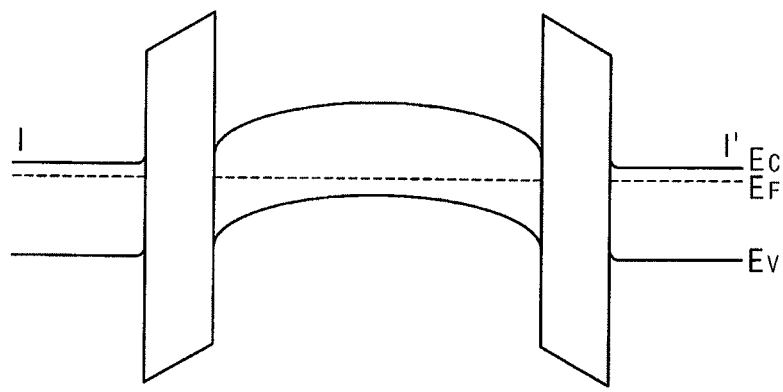
FIG. 14A illustrates an energy band diagram taken along a line I-I' in FIG. 13.
Figure 14B:
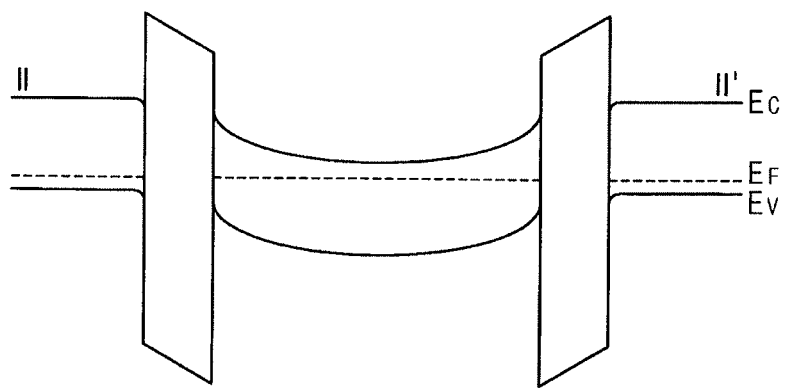
FIG. 14B illustrates an energy band diagram taken along a line II-II' in FIG. 13.

FIG. 13 illustrates a cross-sectional view showing conductivity types of impurities in a doped polysilicon layer pattern and an active region of a substrate in accordance with another embodiment. FIG. 14A illustrates an energy band diagram taken along a line I-I' in FIG. 13. FIG. 14B illustrates an energy band diagram taken along a line II-II' in FIG. 13.

Referring to FIGS. 13 and 14A, a central portion of the p-well region 145 may have many p-type carriers, so that a Fermi level EF may be close to a valence band Ev. However, at an interface portion of the p-well region 145 (adjacent to the polysilicon region 108a doped with n-type impurities), the Fermi level EF may be close to a conductive band Ec due to the balancing of the carriers. Accordingly, a doping concentration of p-type impurities may decrease at the interface, so that the reduction of the cell current may be prevented according as a threshold voltage of a cell transistor may increase in the operation thereof.

Referring to FIGS. 13 and 14B, a central portion of the source/drain 180 may have many n-type carriers, so that a Fermi level EF may be close to a conductive band Ec. However, at an interface portion of the source/drain 180 (adjacent to the polysilicon region 108b doped with p-type impurities), the Fermi level EF may be close to a valence band Ev due to the balancing of the carriers. Accordingly, a doping concentration may decrease at the interface, so that a GIDL current may decrease. As a result, a refresh time may be improved.

Figure 15:
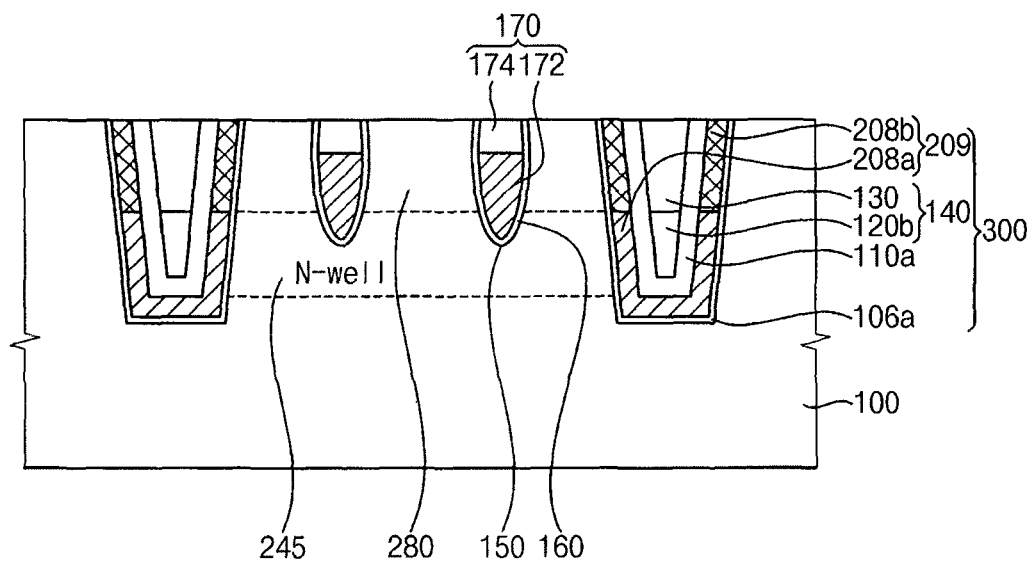
FIG. 15 illustrates a cross-sectional view of a semiconductor device in accordance with yet another embodiment.

FIG. 15 illustrates a cross-sectional view of a semiconductor device in accordance with yet another embodiment. The semiconductor device may include a PMOS transistor. Like reference numerals refer to like elements throughout FIGS. 1-12 and 15, and repeated explanations thereof may be omitted.

Referring to FIG. 15, the semiconductor device may include a doped polysilicon layer pattern 209. The doped polysilicon layer pattern 209 may include a first polysilicon region 208a (doped with p-type impurities) at a lower portion thereof and a second polysilicon region 208b (doped with n-type impurities) at an upper portion thereof.

The first polysilicon region 208a (doped with p-type impurities) may be adjacent to an n-well region 245 (having n-type impurities) in the active region of the substrate 100. The second polysilicon region 208b (doped with n-type impurities) may be adjacent to a source/drain 280 (having p-type impurities) in the active region of the substrate 100. The second polysilicon region 208b (doped with n-type impurities) may be disposed on an upper sidewall of the thermal oxide layer pattern 106a. The first polysilicon region 208a (doped with p-type impurities) may be disposed on a lower sidewall of the thermal oxide layer pattern 106a, so that the doped polysilicon layer pattern 209 may be formed to have a U-shape.

A method of manufacturing the semiconductor device in FIG. 15 may be substantially the same as that illustrated with reference to FIGS. 1 to 12, except for first and second impurities implanted into the substrate. Thus, repeated detailed explanations may be omitted.

A polysilicon layer 208 doped with first impurities may be formed on the thermal oxide layer 106. The first impurities may include p-type impurities, e.g., boron (B), aluminum (Al), gallium (Ga), indium (In), or the like. When the polysilicon layer 208 doped with first impurities includes p-type impurities, holes may move to the n-well region 245 at a portion of the substrate 100 subsequently formed, so that a doping concentration of the n-well region 245 may decrease. If the polysilicon layer 208 doped with first impurities includes n-type impurities, there may be no movement of carriers between the polysilicon layer 208 doped with first impurities and the n-well region 245, so that a doping concentration of the n-well region 245 may not decrease. Accordingly, p-type impurities may be doped as the first impurities.

The nitride layer 110 may be formed on the doped polysilicon layer 208, and the first insulation layer pattern 120b may be formed on the nitride layer 110 to fill the first trench 104. Further, second impurities may be implanted into a portion of the doped polysilicon layer 208 under a lower portion of the nitride layer 110. A source/drain 280 may be formed by implanting p-type impurities into the PMOS transistor. The second impurities may include n-type impurities, e.g., phosphorus (P), arsenic (As), antimony (Sb), or the like. When phosphorus (P) is used as the n-type impurities, the source/drain 280 may be formed using phosphine ($PH_3$) as an impurity gas, by a low energy ion implantation process, a plasma ion implantation process, a pulsed laser ablation deposition process, or the like.

The n-type impurities may be implanted into a portion of the doped polysilicon layer 208 to a depth substantially equal to a depth of the source/drain 280. Thus, the doped polysilicon layer 208 may be divided into a first polysilicon region 208a (doped with p-type impurities) and a second polysilicon region 208b (doped with n-type impurities) on the first polysilicon region 208a.

A second insulation layer pattern 130 may be formed on the first insulation layer pattern 120b and the nitride layer 110. By removing upper portions of the nitride layer 110, doped polysilicon layer 208, and thermal oxide layer 106, an isolation layer structure 300 may be formed to include the thermal oxide layer pattern 106, a doped polysilicon layer pattern 209, the nitride layer pattern 110a, and the insulation structure 140.

The n-well region 245 may be formed at the active region of the substrate 100 by implanting n-type impurities with a low concentration. A top surface of the n-well region 245 may be substantially coplanar with a bottom surface of the first polysilicon region 208a (doped with p-type impurities) of the doped polysilicon layer pattern 209. The gate insulation layer 160 and the gate structure 170 may be formed on the substrate 100, and a source/drain 280 may be formed by implanting p-type impurities into upper portions of the substrate 100 adjacent to the gate structure 170. A bottom surface of the source/drain 280 may be substantially coplanar with or higher than that of the gate structure 170.

As a result, the first polysilicon region 208a (doped with p-type impurities) and the second polysilicon region 208b (doped with n-type impurities) may be adjacent to the n-well region 245 and the source/drain 280 doped with p-type impurities, respectively, so that electron carriers and hole carriers may be balanced at an interface.

In a method of manufacturing a semiconductor device, a polysilicon layer pattern doped with one type impurities at an upper portion thereof and another type impurities at a lower portion thereof may be formed in a trench for forming an isolation layer structure, so that different types of carriers may be balanced at a region adjacent to a body region and a source/drain. Thus, a body effect and a GIDL current may decrease.

By way of summation and review, when a source voltage increases, a threshold of cell transistors may increase to decrease a cell current, so that a write operation may become slower. Thus, a doped polysilicon layer, doped with first and second impurities of first and second conductive types at lower portions thereof respectively, may be formed. In an NMOS transistor, p-type impurities may be implanted into an upper portion, and n-type impurities may be implanted into a lower portion, so that a doping concentration of impurities in a substrate may decrease. Accordingly, a GIDL current may decrease at an interface between the substrate having a source/drain and a STI, and a threshold of the cell transistors may decrease at an interface between the substrate having a p-well region and the STI to increase the cell current and a speed of the write operation. In a PMOS transistor, a principle may be substantially the same as that of the NMOS transistor without types of impurities.

The embodiments provide a semiconductor device having improved electrical characteristics. The embodiments also provide a method of manufacturing a semiconductor device having improved electrical characteristics.

For example, in a method of manufacturing a semiconductor device, a polysilicon layer pattern doped with one type of impurities at an upper portion thereof and another type of impurities at a lower portion thereof may be formed in a trench for forming an isolation layer structure, so that different types of carriers may be balanced at a region adjacent to a body region and a source/drain. Thus, a body effect and a GIDL current may be decreased.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
an isolation layer structure, the isolation structure including:
a doped polysilicon layer pattern doped with first and second impurities of first and second conductivity types at lower and upper portions thereof, respectively, the doped polysilicon layer pattern being on an inner wall of a first trench on a substrate, the substrate being divided into an active region in which the first trench is not formed and a field region in which the first trench is formed, and
an insulation structure filling a remaining portion of the first trench;
a gate structure on the active region of the substrate;
a well region at a portion of the active region adjacent to the lower portion of the doped polysilicon layer pattern, the well region being doped with third impurities of the second conductivity type; and
a source/drain at a portion of the active region adjacent to the upper portion of the doped polysilicon layer pattern, the source/drain being doped with fourth impurities of the first conductivity type.

2. The semiconductor device as claimed in claim 1, wherein the insulation structure includes a first insulation layer pattern and a second insulation layer pattern sequentially stacked thereon.

3. The semiconductor device as claimed in claim 1, wherein the isolation layer structure further includes a nitride layer pattern between the inner wall of the first trench and the doped polysilicon layer pattern.

4. The semiconductor device as claimed in claim 3, wherein the isolation layer structure further includes a thermal oxide layer pattern between the inner wall of the first trench and the nitride layer pattern.

5. The semiconductor device as claimed in claim 1, wherein the gate structure fills a second trench in the active region.

6. A method of manufacturing a semiconductor device, the method comprising:
forming an isolation layer structure such that forming the isolation layer structure includes:
forming a doped polysilicon layer pattern doped with first and second impurities of first and second conductivity types at lower and upper portions thereof, respectively, the doped polysilicon layer pattern being on an inner wall of a first trench on a substrate, the substrate being divided into an active region in which the first trench is not formed and a field region in which the first trench is formed, and
forming an insulation structure on the doped polysilicon layer pattern to fill a remaining portion of the first trench;
forming a well region by implanting third impurities of the second conductivity type into a portion of the active region adjacent to the lower portion of the doped polysilicon layer pattern;
forming a gate structure on the active region; and
forming a source/drain by implanting fourth impurities of the first conductivity type into a portion of the active region adjacent to the upper portion of the doped polysilicon layer pattern.

7. The method as claimed in claim 6, wherein:
the first conductivity type is n-type, and
the second conductivity type is p-type.

8. The method as claimed in claim 7, wherein:
the first and fourth impurities include one of phosphorus, arsenic, and antimony, and
the second and third impurities include one of boron, aluminum, gallium, and indium.

9. The method as claimed in claim 6, wherein forming the isolation layer structure includes:
forming a polysilicon layer doped with the first impurities on the inner wall of the first trench and a top surface of the substrate,
forming a first insulation layer pattern on the doped polysilicon layer to partially fill the first trench,
implanting the second impurities into a portion of the doped polysilicon layer not covered by the first insulation layer pattern, and
forming a second insulation layer pattern on the first insulation layer pattern to fill a remaining portion of the first trench.

10. The method as claimed in claim 9, wherein forming the first insulation layer pattern includes:
forming a first insulation layer on the doped polysilicon layer to sufficiently fill the first trench, and
removing an upper portion of the first insulation layer by a wet etching process.

11. The method as claimed in claim 10, wherein forming the second insulation layer pattern includes:
forming a second insulation layer on the first insulation layer pattern to fill a remaining portion of the first trench, and
planarizing an upper portion of the second insulation layer.

12. The method as claimed in claim 6, wherein a top surface of the well region is substantially coplanar with a top surface of the lower portion of the doped polysilicon layer pattern doped with the first impurities.

13. The method as claimed in claim 6, wherein a bottom surface of the source/drain is substantially coplanar with a bottom surface of the upper portion of the doped polysilicon layer pattern doped with the second impurities.

14. The method as claimed in claim 6, further comprising forming a nitride layer on the inner wall of the first trench prior to forming the doped polysilicon layer pattern.

15. The method as claimed in claim 6, further comprising forming a thermal oxide layer on the inner wall of the first trench prior to forming the gate structure.

16. A semiconductor device, comprising:
- a substrate including a trench therein, the substrate including an active region and a field region and the trench being in the field region;
- an isolation layer structure in the trench, the isolation structure including:
  - a thermal oxide layer pattern on an inner wall of the trench,
  - a doped polysilicon layer pattern on the thermal oxide layer pattern, the doped polysilicon layer being doped with first impurities having a first conductivity type at a lower portion thereof and being doped with second impurities of a second conductivity type at an upper portion thereof, and
  - an insulation structure on the doped polysilicon layer pattern, the insulation structure filling a remaining portion of the trench;
- a gate structure on the active region of the substrate;
- a well region at a portion of the active region adjacent to the lower portion of the doped polysilicon layer pattern, the well region being doped with third impurities of the second conductivity type; and
- a source/drain at a portion of the active region adjacent to the upper portion of the doped polysilicon layer pattern, the source/drain being doped with fourth impurities of the first conductivity type.

17. The semiconductor device as claimed in claim 16, wherein a top surface of the well region is substantially coplanar with a bottom surface of the upper portion of the doped polysilicon layer pattern.

18. The semiconductor device as claimed in claim 17, wherein a bottom surface of the well region is substantially coplanar with or higher than a bottom surface of the isolation layer structure.

19. The semiconductor device as claimed in claim 16, wherein a bottom surface of the source/drain is substantially coplanar with a bottom surface of the upper portion of the doped polysilicon layer pattern.

20. The semiconductor device as claimed in claim 16, wherein the isolation layer structure further includes a nitride layer pattern between the thermal oxide layer pattern and the doped polysilicon layer pattern.

* * * * *